United States Patent [19]

Suga

[11] Patent Number: 5,747,994
[45] Date of Patent: May 5, 1998

[54] BOARD EXCHANGE MECHANISM FOR SEMICONDUCTOR TEST SYSTEM

[75] Inventor: Kazunari Suga, Goyoda, Japan

[73] Assignee: Advantest Corp., Tokyo, Japan

[21] Appl. No.: 638,037

[22] Filed: Apr. 26, 1996

[30] Foreign Application Priority Data

Apr. 28, 1995 [JP] Japan .................................. 7-129849

[51] Int. Cl.[6] ................................................ G01R 31/02
[52] U.S. Cl. .................................... 324/158.1; 324/754
[58] Field of Search ............................. 324/158.1, 73.1,
324/754, 755, 769, 765; 371/15.1, 25.1;
364/552, 550

[56] References Cited

U.S. PATENT DOCUMENTS

| | | | |
|---|---|---|---|
| 3,599,092 | 8/1971 | Silverman | 364/578 |
| 3,665,504 | 5/1972 | Silverman | 324/158.1 |
| 4,918,374 | 4/1990 | Stewart et al. | 324/73.1 |
| 5,448,164 | 9/1995 | Selley et al. | 324/754 |
| 5,489,843 | 2/1996 | Erjavic et al. | 324/158.1 |

Primary Examiner—Vinh P. Nguyen
Attorney, Agent, or Firm—Muramatsu & Associates

[57] ABSTRACT

A board exchange mechanism for a self-diagnosis process excludes the need of disconnecting a test head from a wafer prober for installing a self-diagnosis board. The board exchange mechanism for a semiconductor test system having a plurality of test channels includes: a test head connected to the semiconductor test system and having a plurality of print circuit boards corresponding to the plurality of test channels; a wafer prober having a pin card for electrically contacting a semiconductor wafer to be tested for supplying test signals to the semiconductor wafer; a performance board for interfacing the plurality of print circuit boards and the pin card when the test head and the wafer prober are mechanically connected with each other; a self-diagnosis board which is sized equal to the size of the pin card of the wafer prober; wherein the pin card is replaced with the self-diagnosis board prior to a self-diagnosis test while the test head and the wafer prober remain mechanically connected and wherein the performance board interfaces the plurality of print circuit boards and the self-diagnosis board.

1 Claim, 3 Drawing Sheets

5,747,994

BOARD EXCHANGE MECHANISM FOR SEMICONDUCTOR TEST SYSTEM

FIELD OF THE INVENTION

This invention relates to a mechanism to be used in a semiconductor test system for exchanging a print circuit board, and more particularly, to a board exchange mechanism for inserting a print circuit board for self-diagnosis in the semiconductor test system without disconnecting a test head of the test system from a wafer prober.

BACKGROUND OF THE INVENTION

In testing a semiconductor device which is in a form of a semiconductor wafer, a semiconductor test system is usually connected to a wafer prober to automatically test the semiconductor wafer. A semiconductor test system has a test head which is ordinarily in a separate housing and electrically connected to the test system with a bundle of cables. The test head and the wafer prober are mechanically connected and semiconductor wafers to be tested are automatically provided to a position corresponding to the test head by the wafer prober.

On the test head, the semiconductor wafer to be tested is provided with test signals generated by the semiconductor test system. The resulted output signals from the semiconductor wafer under test are transmitted to the semiconductor test system wherein they are compared with expected data to determine whether IC circuits in the semiconductor wafer work correctly or not.

Prior to the test, the semiconductor test system undertakes a self-diagnosis process. Such a self-diagnosis may be performed at every fixed period of time, such as every morning, or when a kind of semiconductor wafer is changed, or other occasions such as a trouble shooting for the semiconductor test system.

The test head and the wafer prober are interfaced with a performance board which is a print circuit board having electric circuit connections peculiar to a semiconductor wafer to be tested. In the self-diagnosis process, the performance board is replaced with a self-diagnosis board having electric connections and circuits to effectively test the performance of the semiconductor test system.

An example of a conventional process for proceeding a self-diagnosis by replacing a performance board with a self-diagnosis board is shown in FIGS. 3 and 4. A test head 100 is connected to the semiconductor test system through a cable 110. The cable 110 is actually a bundle of several hundreds of cables. When testing semiconductor wafers, the test head 100 and a wafer prober 400 are connected through a performance board 120 as shown in the right side of FIG. 3.

For the self-diagnosis test, the test head 100 has to be disconnected from the wafer prober 400 and the performance board 120 is replaced with a self-diagnosis board 200 as shown in the left side of FIG. 3. Since the test head 100 is a heavy equipment, 200 Kg or more for example, a manipulator 300 assists the movement of the test head 100 in connecting or disconnecting to or from the wafer prober 400. The manipulator 300 rotates about 180 degrees by the drive force of a motor 310.

Even the aid of the manipulator 300, an accurate positioning between the test head 100 and the wafer prober is not an easy task. In addition, several persons usually have to participate in the work for rotating the test head because of a safety precaution since the test head 100 is very heavy.

Since the test head 100 has several hundreds of test channels to test a semiconductor device having several hundreds of input and output pins, the performance board and the self-diagnosis board have a relatively large size and include a large number of connectors corresponding to such test channels. Thus, the replacement of these boards involves a complicated and time consuming process.

FIG. 4 illustrates a more detailed image for replacing the performance board with the self-diagnosis board on the test head. Since the test head 100 is disconnected from the wafer prober 400 and 180 degrees rotated by the manipulator 300 of FIG. 3, the performance board 120 comes over the test head and is disconnected from the test head 100.

The test head 100 includes a large number of print circuit boards 150 which correspond to the number of test channels. Each of the print circuit boards has a connector 160 to receive a corresponding contact terminal 121 of the performance board 120. A flog ring 130 is mounted on the performance board 120 to accurately determine the contact position with the wafer prober 400. The flog ring 130 has a large number of contact pins 141, such as ZIF connectors or pogo-pins, connected to contact terminals 121.

The self-diagnosis board 200 has contact terminals 260 to be received by the connectors 160 of the print circuit boards 150 of the test head 100. The self-diagnosis board 200 also includes circuit connections 220 designed to effectively test the overall performance of the semiconductor test system.

Since the performance board 120 is large in size, 600 mm by 600 mm for example, and has a large number of contact terminals 121, more than 500 for example, the process for connecting or disconnecting the performance board is time consuming and needs special precautions because each contact terminals are aligned in a fine pitch. Further, such process involves a risk that the contact pins or terminals may be damaged. Attaching the self-diagnosis board 200 to the test head 100 also requires a relatively long time as well as involving a risk of damaging contact terminals 260.

FIG. 5 shows a structure of the wafer prober 400, the test head 100 and the performance board 120 when testing a semiconductor wafer. As shown in the right side of FIG. 3, the test head 100 is placed over the wafer prober 400 and mechanically and electrically connected to the wafer prober through the performance board 120.

In the wafer prober 400, a semiconductor wafer 300 to be tested is mounted on a chuck 180. A probe card 170 is provided above the semiconductor wafer 300 to be tested. The probe card 170 has a large number of probe needles 190 to contact with circuit terminals in the IC circuit of the wafer 300. Since the alignment of the probe needles 190 varies depending on the kind of semiconductor wafer to be tested, the probe card 170 will be exchanged to another probe card having a suitable alignment of the probe needles 190 when a different type semiconductor wafer is to be tested.

Thus, a plurality of different probe cards 170 are prepared and one probe card is replaced with another when a kind of semiconductor wafer to be tested needs a different probe card 170. In a modern wafer prober, such a replacement of the probe card is proceeded by a special mechanism, manual or automatic, provided for the wafer prober. It is, therefore, unnecessary to disconnect the test head 100 from the wafer prober 400.

Electric terminals or contact receptacles of the probe card 170 are electrically connected to the contact pins 141 provided on the flog ring 130. The contact pins 141 are also connected to the contact terminals 121 of the performance board 120 where each contact terminal 121 is connected to the print circuit board 150 of the test head 100. Further, the print circuit boards 150 are connected to the semiconductor test system through the cable 110 having several hundreds of inner cables.

Under this arrangement, the probe needles 190 contact with the surface of the semiconductor wafer 300 on the chuck 180 to apply test signals to the semiconductor wafer 300 and receive output signals from the wafer 300. The output signals are compared with the expected data generated by the semiconductor test system to determine whether the semiconductor wafer 300 under test performs correctly or not.

As shown in FIG. 5, there are numerous connection points in the overall system between the test head 100 and the semiconductor wafer 300 to be tested. Since the test handler has a large number of test channels, 500 or more for example, the connection position (a) of FIG. 5 in which the print circuit boards 150 and the performance board 120 are connected is one of the important point to assure that all the connections work correctly. Other connection position of concern is the position (b) of FIG. 5 in which the contact pins 141 contact the contact receptacles of the probe card 170.

In the conventional semiconductor test system, since the performance board is replaced with the self-diagnosis board as in the foregoing, possible connection errors or circuit errors in the positions (a) and (b) in the actual test conditions are not effectively diagnosed. Namely, the self-diagnosis test in the conventional test system is not able to sufficiently identify problems involved in the semiconductor test system.

In addition, since the replacement of the performance board requires a movement of the test head by 180 degrees and such movement of the test head requires the works of several persons as noted above, considerable amount of workhours have to be consumed prior to the self-diagnosis test. Further, there involves a risk in which the contact terminals may be damaged during the replacement process. Furthermore, the bundle of cables connecting the test head and the semiconductor test system will receive a stress every time when the test head is rotated for the replacement of the boards, which may cause a damage to the cables.

SUMMARY OF THE INVENTION

It is therefore an object of the present invention to provide a board exchange mechanism for a semiconductor test system which is capable of installing a self-diagnosis board without disconnecting the test head of the semiconductor test system from a wafer prober.

It is another object of the present invention to provide a board exchange mechanism for a semiconductor test system which is capable of replacing a pin card in a wafer prober with a self-diagnosis board without disconnecting the test head of the semiconductor test system from the wafer prober.

It is a further object of the present invention to provide a board exchange mechanism for a semiconductor test system which is capable of performing a self-diagnosis test with conditions substantially the same as the actual test conditions for a semiconductor wafer.

It is a further object of the present invention to provide a board exchange mechanism for a semiconductor test system which is capable of performing a self-diagnosis test in a location closer to the semiconductor wafer to be tested.

It is a further object of the present invention to provide a board exchange mechanism for a semiconductor test system which is capable of replacing a pin card of a wafer prober with a self-diagnosis board easily without requiring long workhours.

It is a further object of the present invention to provide a board exchange mechanism for a semiconductor test system which is capable of performing a self-diagnosis test without disconnecting the test head of the semiconductor test system from the wafer prober so as to obviate a risk of damaging contact pins or terminals of the test head and a performance board.

In the present invention, the board exchange mechanism for a self-diagnosis process excludes the need of disconnecting the test head from the wafer prober for installing a self-diagnosis board.

In the present invention, the board exchange mechanism for a semiconductor test system having a plurality of test channels includes: a test head connected to the semiconductor test system and having a plurality of print circuit boards corresponding to the plurality of test channels; a wafer prober having a pin card for electrically contacting a semiconductor wafer to be tested for supplying test signals from the semiconductor test system to the semiconductor wafer and transmitting output signals from the semiconductor wafer to the semiconductor test system; a performance board for interfacing the plurality of print circuit boards and the pin card when the test head and the wafer prober are mechanically connected with each other; a self-diagnosis board which is sized equal to the size of the pin card of the wafer prober; wherein the pin card is replaced with the self-diagnosis board prior to a self-diagnosis test while the test head and the wafer prober remain mechanically connected with each other and wherein the performance board interfaces the plurality of print circuit boards and the self-diagnosis board.

According to the present invention, the self-diagnosis board can be installed without disconnecting the test head of the semiconductor test system from the wafer prober. The board exchange mechanism of the present invention is capable of replacing the pin card in the wafer prober with the self-diagnosis board without disconnecting the test head of the semiconductor test system from the wafer prober.

In the present invention, the board exchange mechanism for the semiconductor test system is capable of performing the self-diagnosis test with the condition substantially the same as the actual test condition for a semiconductor wafer by performing the self-diagnosis test at the location closer to the semiconductor wafer to be tested.

Since the test head is a heavy equipment, by obviating the need of disconnecting the test head when performing the self-diagnosis test, the board exchange mechanism of the present invention is capable of replacing the pin card of the wafer prober with the self-diagnosis board easily without requiring the long workhours.

Further, the board exchange mechanism for a semiconductor test system of the present invention is capable of performing the self-diagnosis test without disconnecting the test head of the semiconductor test system from the wafer prober, which can eliminated the risk of damaging contact pins or terminals of the test head and the performance board.

In addition, since the repeated movements of the test head is no longer necessary, the stress to the cable connecting the test head and the semiconductor test system is not applied in the test present invention, which makes the overall system more reliable.

DETAILED DESCRIPTION OF THE PREFERRED EMBODIMENT

Figure 1:
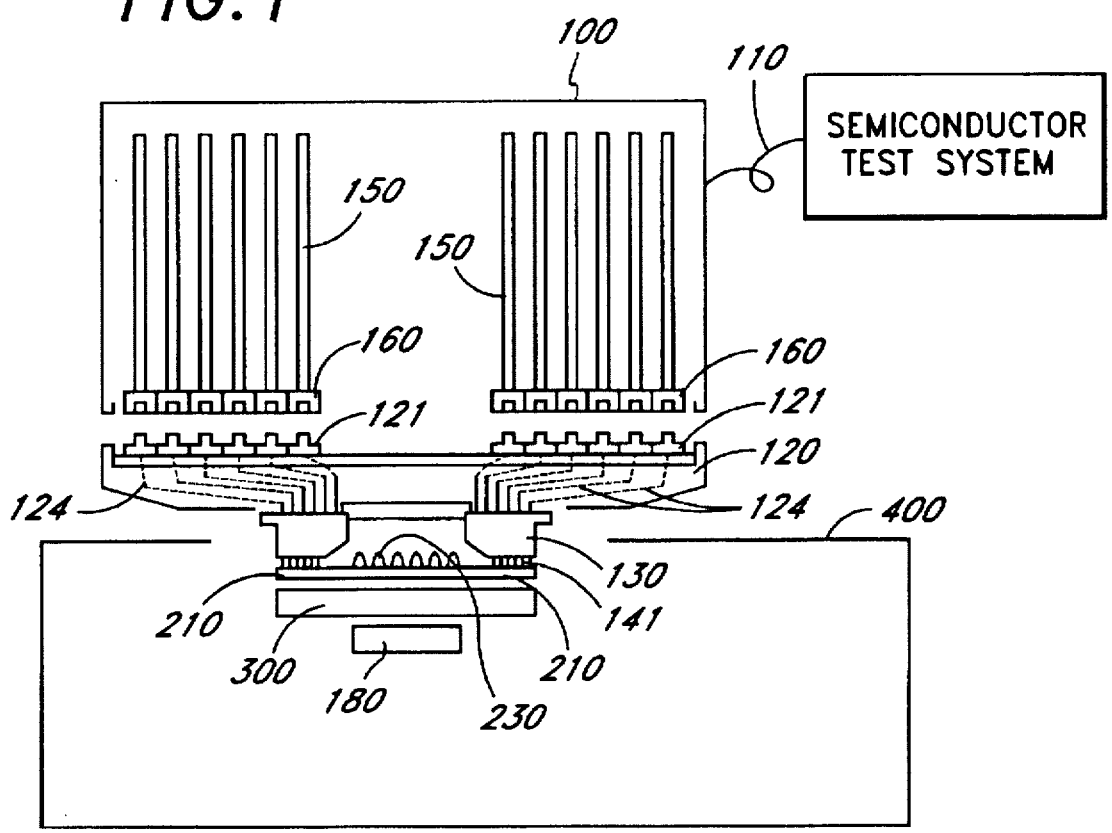
FIG. 1 is a partially cut out front view showing a test head and a wafer prober for explaining a mechanism for exchanging a probe card with a self-diagnosis board.

FIG. 1 is a partially cut out front view showing a test head and a wafer prober for explaining a mechanism for exchanging a probe card with a self-diagnosis board. In a self-diagnosis process, without disconnecting a test head 100 from a wafer prober 400, a probe card 170 in the wafer prober 400 is extracted and is replaced with a self-diagnosis board 210 by a probe card exchange mechanism. Then, the semiconductor test system proceeds a self-diagnosis program.

In this arrangement, test signals for the self-diagnosis test pass through the test head 100, the connections between print circuit boards 150 and a performance board 120, and the connections between contact pins 141 of a flog ring 130 and the self-diagnosis board 210. Thus, the self-diagnosis test can identify any problems existing in the connections between the performance board 120 and the print circuit boards 150 and the connections between the contact pins 141 and the self-diagnosis board 210.

Figure 2:
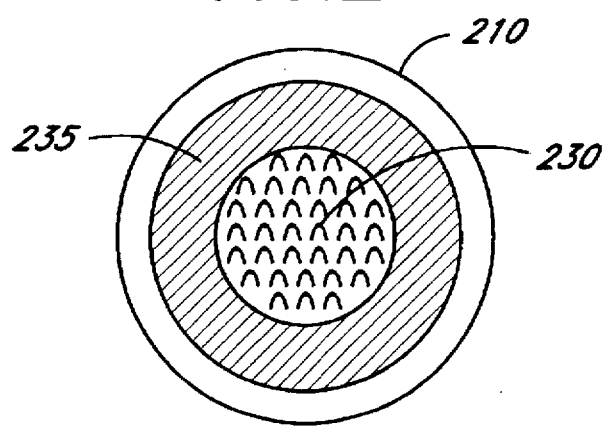
FIG. 2 is a plan view showing a self-diagnosis board having contact receptacles and self-diagnosis circuits.
Figure 3:
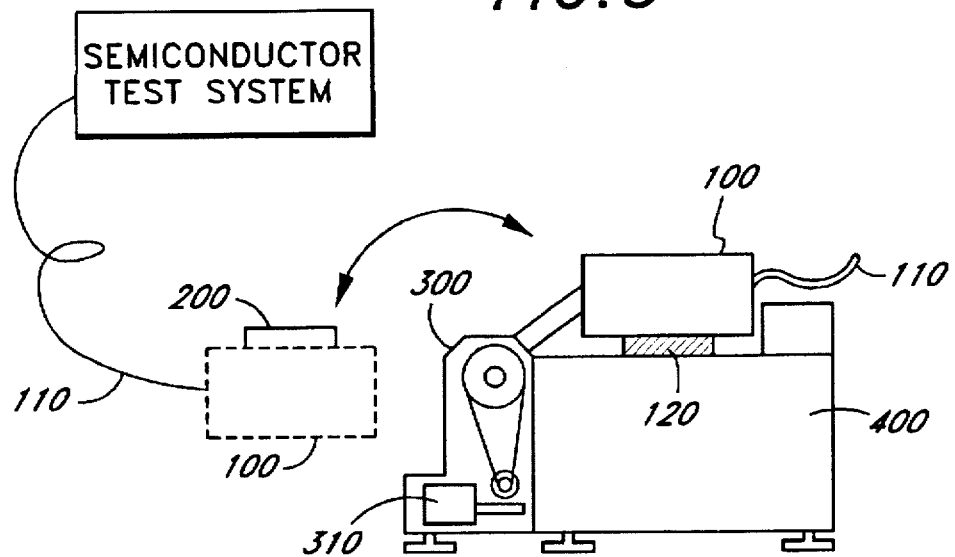
FIG. 3 is a front view showing an example of conventional method of connecting and disconnecting a test head using a manipulator.
Figure 4:
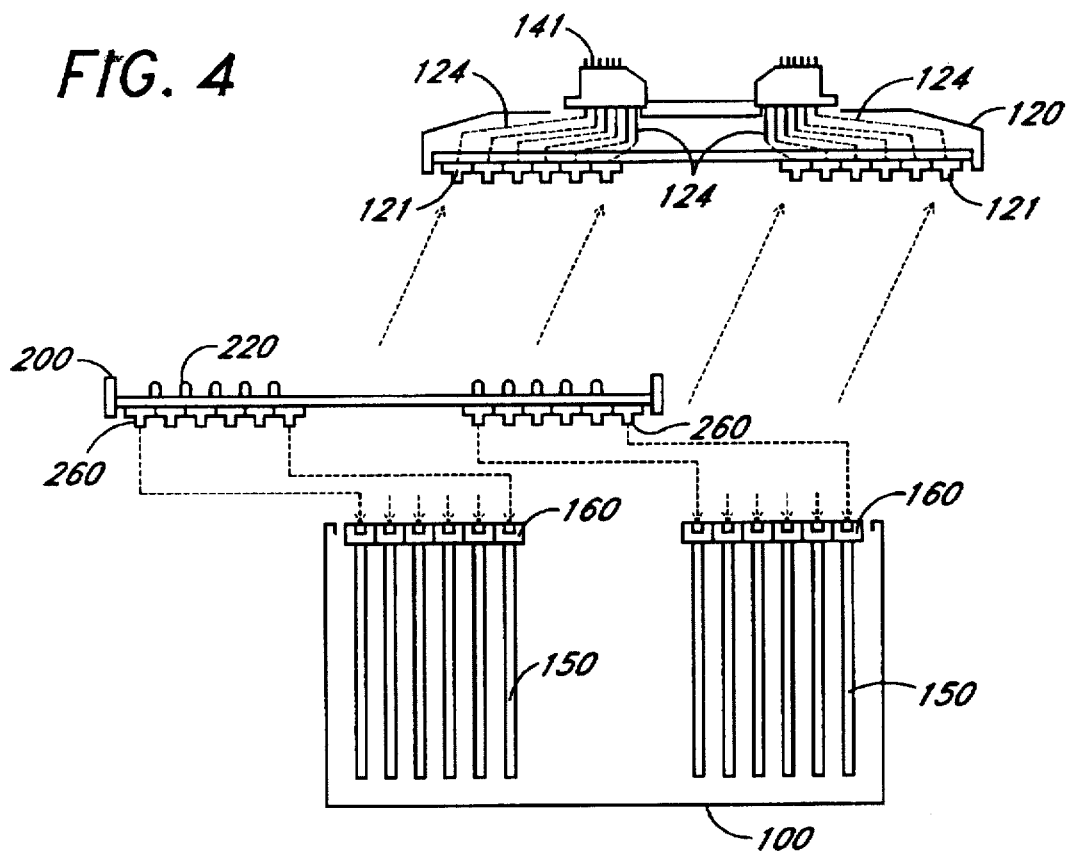
FIG. 4 is a side view showing a situation of replacing a performance board with a self-diagnosis board in the conventional test system.
Figure 5:
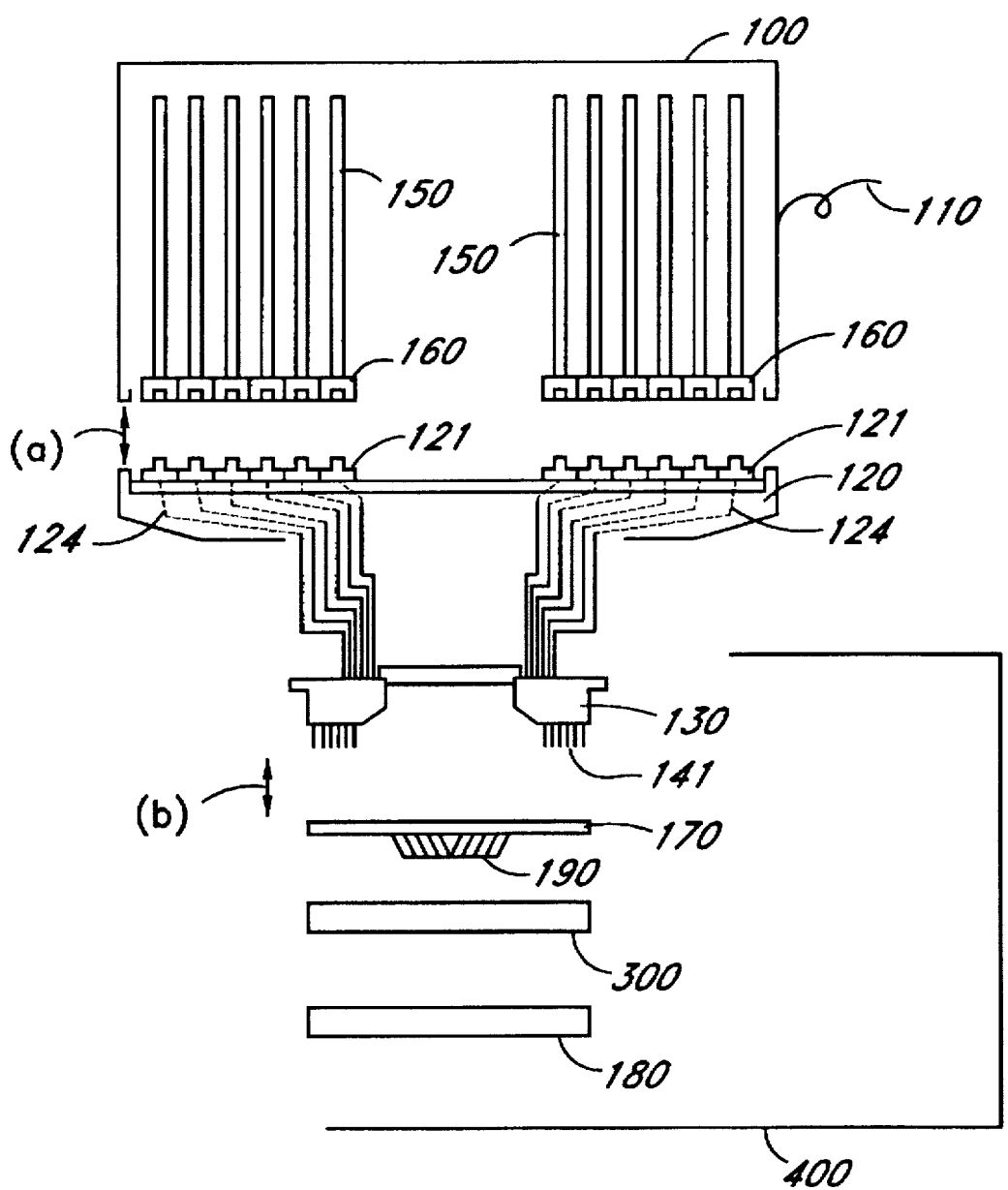
FIG. 5 is a front view showing a structure of a test head, a performance board and a wafer prober for testing a semiconductor wafer in the conventional semiconductor test system.

FIG. 2 shows an example of a self-diagnosis board to be used in the present invention. The self-diagnosis board 210 has an identical diameter and thickness to that of the pin card 170. On an upper surface of the self-diagnosis board 210, a number of contact receptacles 235 are provided to be accurately connected with the contact pins 141 of the flog ring 130. An inner area of the board 210 is a self-diagnosis circuit 230 designed to effectively identify any problems in the semiconductor test system. The contact receptacles 235 are electrically connected to the self-diagnosis circuit 230. The self-diagnosis circuit 230 is preferably arranged within an area which is smaller than a space formed by the flog ring 130.

For fully testing an overall semiconductor test system, a large scale of circuitry is required as exemplified by the conventional self-diagnosis board having the size of 600 mm by 600 mm. Since the size of the self-diagnosis board 210 of the present invention is considerably smaller than the performance board 120 or the conventional self-diagnosis board, a plurality of self-diagnosis boards 210 will be prepared to fully diagnose the overall semiconductor test system.

As in the foregoing, according to the present invention, the self-diagnosis board can be installed without disconnecting the test head of the semiconductor test system from the wafer prober. The board exchange mechanism of the present invention is capable of replacing the pin card in the wafer prober with the self-diagnosis board without disconnecting the test head of the semiconductor test system from the wafer prober.

In the present invention, the board exchange mechanism for the semiconductor test system is capable of performing the self-diagnosis test with the condition substantially the same as the actual test condition for a semiconductor wafer by performing the self-diagnosis test at the location closer to the semiconductor wafer to be tested.

Since the test head is a heavy equipment, by obviating the need of disconnecting the test head when performing the self-diagnosis test, the board exchange mechanism of the present invention is capable of replacing the pin card of the wafer prober with the self-diagnosis board easily without requiring the long workhours.

Further, the board exchange mechanism for a semiconductor test system of the present invention is capable of performing the self-diagnosis test without disconnecting the test head of the semiconductor test system from the wafer prober, which can eliminated the risk of damaging contact pins or terminals of the test head and the performance board.

In addition, since the repeated movements of the test head is no longer necessary, the stress to the cable connecting the test head and the semiconductor test system is not applied in the present invention, which makes the overall system more reliable.

What is claimed is:

1. A board exchange mechanism for a semiconductor test system having a plurality of test channels, said board exchange mechanisms is used for performing a self-diagnosis test, comprising:

a test head connected to said semiconductor test system and having a plurality of print circuit boards corresponding to said plurality of test channels;

a wafer prober having a pin card for electrically contacting a semiconductor wafer to be tested for supplying test signals from said semiconductor test system to said semiconductor wafer and transmitting output signals from said semiconductor wafer to said semiconductor test system;

a performance board for interfacing said plurality of print circuit boards and said pin card when said test head and said wafer prober are mechanically connected with each other;

a self-diagnosis board which is sized equal to the size of said pin card of said wafer prober;

wherein said pin card is replaced with said self-diagnosis board prior to a self-diagnosis test while said test head and said wafer prober remain mechanically connected with each other, and said performance board interfacing said plurality of print circuit boards and said self-diagnosis board.

* * * * *